(12) United States Patent
Uematsu et al.

(10) Patent No.: US 7,772,658 B2
(45) Date of Patent: Aug. 10, 2010

(54) SEMICONDUCTOR DEVICE AND METHOD OF MANUFACTURING SAME

(75) Inventors: Katsuyuki Uematsu, Hata-machi (JP); Shigeru Shinoda, Matsumoto (JP); Kimihiro Ashino, Matsumoto (JP)

(73) Assignee: Fuji Electric Systems Co., Ltd. (JP)

( * ) Notice: Subject to any disclaimer, the term of this patent is extended or adjusted under 35 U.S.C. 154(b) by 176 days.

(21) Appl. No.: 11/849,328

(22) Filed: Sep. 3, 2007

(65) Prior Publication Data

US 2008/0054384 A1 Mar. 6, 2008

(30) Foreign Application Priority Data

Sep. 4, 2006 (JP) .............................. 2006-238856

(51) Int. Cl.
*H01L 29/84* (2006.01)
(52) U.S. Cl. .................. 257/415; 257/88; 257/704; 257/792
(58) Field of Classification Search ............... 257/88, 257/89, 99, 100, 676, 415, E21.001, E21.499, 257/E23.031
See application file for complete search history.

(56) References Cited

U.S. PATENT DOCUMENTS 5,161,304 A * 11/1992 Queyssac et al. ............. 29/827
5,637,995 A * 6/1997 Izawa et al. .................. 324/174
6,255,741 B1 * 7/2001 Yoshihara et al. ............ 257/792
6,833,608 B2 12/2004 Asano et al.
2004/0238943 A1 * 12/2004 Fujii .......................... 257/704
2004/0245895 A1 * 12/2004 Shimodaira et al. .......... 310/348
2006/0231848 A1 * 10/2006 Fu ............................... 257/88

FOREIGN PATENT DOCUMENTS

| JP | 06-186104 A | 7/1994 |
|---|---|---|
| JP | 2003-152009 A | 5/2003 |
| JP | 2003-289130 B2 | 10/2003 |

* cited by examiner

Primary Examiner—Wai-Sing Louie
Assistant Examiner—Sue Tang
(74) Attorney, Agent, or Firm—Rossi, Kimms & McDowell LLP

(57) ABSTRACT

A lead frame which is disposed in an outer package is composed of three members. The lead frame is provided with contact electrodes, connector terminals, and conductive interconnections which are connected to the respective connector terminals. The arrangement order of the contact electrodes is such that contact electrodes are connected to the connector terminals, respectively; that is, the arrangement direction of the contact electrodes is the same as that of the connector terminals. On the other hand, the arrangement order of the contact electrodes is such that contact electrodes are connected to the connector terminals, respectively, that is, the arrangement direction of the contact electrodes is opposite to that of the connector terminals. Lead terminals of a resin cell package are connected to the contact electrodes.

15 Claims, 9 Drawing Sheets

SEMICONDUCTOR DEVICE AND METHOD OF MANUFACTURING SAME

CROSS-REFERENCE TO RELATED APPLICATION

This application claims priority from Japanese Patent Application 2006-238856 filed on Sep. 4, 2006, the contents of which are incorporated herein by reference.

BACKGROUND

The present invention relates to the interface of a semiconductor device and, more specifically, to a semiconductor capable of easily adapting to interface conditions for a host application.

FIGS. 7A and 7B are plan views of important parts of semiconductor devices each of which is composed of a semiconductor integrated circuit device and a package that is mounted with the semiconductor integrated circuit device. In general, as shown in FIGS. 7A and 7B, electrode pads 92 on a semiconductor integrated circuit device 91 are arranged in the same order as lead terminals 93 which lead from a package 95. However, as for the interface with a host system to which this semiconductor device is to be connected, the arrangement order of the terminals may vary depending on the user for a reason on the host system side. This results in a problem in that semiconductor integrated circuit devices 91 cannot be made common in the case where they are manufactured so as to adapt to terminal arrangement orders of respective users as shown in FIGS. 7A and 7B.

Where semiconductor integrated circuit devices cannot be made common, the lead time and the cost that are taken in the development, including the evaluation of performance and reliability, of each semiconductor integrated circuit device are increased and the productivity is lowered because a flow with discrimination and procedure switching are needed on a manufacturing line. Furthermore, in recent years, semiconductor devices have come to be required to satisfy increased levels of requirements relating to EMC (electromagnetic compatibility) resistance (i.e., resistance to electromagnetic noise or a surge). Since the EMC resistance is very sensitive to the electrode pad arrangement and the wiring layout on a semiconductor integrated circuit device, designing for EMC is performed by repeating trial manufacture and evaluation of a device. Designing and developing semiconductor integrated circuit devices including designing for EMC for respective users who require different terminal arrangement orders is risky in terms of the lead time and the manufacturing cost.

On the other hand, as for the package shape, the current situation is such that commonization of packages is difficult because of a variety of requirements of users relating to the connector shape, the distance between connector terminals, and the package capacity (reduction). In view of this, a manufacturing method is employed in which a semiconductor integrated circuit device is formed on a small package called "cell package" having a common shape, its circuit characteristics are trimmed, and finally the common cell package is incorporated into an outer package having a shape that is desired by a user. This method makes it possible to commonize as many parts of manufacturing processes as possible and to thereby reduce the cost and the quality degradation. As such, this method can accommodate a wide variety of applications.

A specific conventional example, which is a semiconductor pressure sensor, will be described below with reference to FIGS. 8A and 8B. FIG. 8A is a schematic plan view of a pressure sensor cell and FIG. 8B is a schematic sectional view taken along line A-A in FIG. 8A. A pressure sensor cell 80 of FIGS. 8A and 8B is an exemplary sensor which is used in an engine intake manifold, for example. A Wheatstone bridge (not shown) having four piezoresistance elements which converts pressure into strain, a power electrode pad (not shown) for introduction of power from the outside, and a ground potential electrode pad (not shown) for introduction of a ground potential from the outside are formed on a semiconductor integrated circuit device 12. An output signal of the Wheatstone bridge is amplified by an amplifier circuit (not shown) which is incorporated in the semiconductor integrated circuit device 12, and the amplified signal can be output from the device via an output electrode pad (not shown) for output of a sensor signal which is also formed on the semiconductor integrated circuit device 12. Trimming electrode pads (not shown) for input/output of signals for trimming the characteristics of the above-mentioned amplifier circuit etc. are also formed on the semiconductor integrated circuit device 12. The semiconductor integrated circuit device 12 is bonded to a glass seat 13 by anodic bonding, and they thus constitute a pressure detecting element 10. The pressure detecting element 10 is fixed to, with an adhesive, and contained in a resin cell package 20 which incorporates, as a result of insert molding, a power lead terminal 21 for introduction of power from the outside, a ground potential lead terminal 23 for introduction of a ground potential from the outside, an output lead terminal 22 for output of a sensor signal to the outside, and circuit characteristics trimming lead terminals 24. The power electrode pad, the ground potential electrode pad, the output electrode pad, and the trimming electrode pads of the semiconductor integrated circuit device 12 are connected to the power lead terminal 21, ground potential lead terminal 23, the output lead terminal 22, and the trimming lead terminals 24 of the resin cell package 20, respectively, via Al or Au bonding wires 26. A gel member 27 is charged so as to protect the pressure detecting element 10 and the bonding wires 26. In FIGS. 8A and 8B, the trimming lead terminals 24 are drawn so as to have shapes that are obtained after cutting. In the pressure sensor device, the trimming lead terminals 24 are cut after trimming the circuit characteristics because they are no longer necessary during operation. The pressure sensor cell 80 is mounted on an outer package 40 shown in FIGS. 9A and 9B and electrically connected to the outside via connector terminals 45-47.

FIG. 9A is a schematic plan view of a pressure sensor device and FIG. 9B is a schematic sectional view taken along line B-B in FIG. 9A. The pressure sensor cell 80 of FIGS. 8A and 8B is incorporated in the outer package 40 having a power contact electrode 41, a sensor output contact electrode 42, and a ground potential contact electrode 43. The power lead terminal 21, the ground potential lead terminal 23, the output lead terminal 22 are welded to the power contact electrode 41, the ground potential contact electrode 43, and the sensor output contact electrode 42, respectively. The outer package 40 is closed tightly by a cap (not shown).

In the above conventional example, the arrangement order of the electrode pads on the semiconductor integrated circuit device 12 is the same as that of the power lead terminal 21, the output lead terminal 22, and the ground potential lead terminal 23 of the pressure sensor cell 80. In the outer package 40 which incorporates the pressure sensor cell 80, the arrangement order of the connector terminals 45-47 are the same as the electrode pads on the semiconductor integrated circuit device 12. Therefore, when the terminal arrangement order of the connector receiving side of a host system is changed, a new semiconductor integrated circuit device 12 is designed in which the arrangement order of its electrode pads is changed or crossed wiring is employed in connecting means which connect the semiconductor integrated circuit device 12 to the lead terminals 21-23 of the pressure sensor cell 80.

Alternatively, the terminal arrangement order is converted by modifying the lead terminals 21-23 and adjusting their wire bonding connecting positions to the electrode pads on the semiconductor integrated circuit device 12. For example, JP-A-6-186104 (FIGS. 6 and 7) discloses a technique relating to wire bonding between the bonding pads on a semiconductor pressure sensor device and a lead frame of a package. The arrangement order of lead terminals leading from the package is converted by elongating parts of inner leads of the lead frame of the package and adjusting the inner-lead-side wire bonding positions. In U.S. Pat. No. 6,833,608 (corresponds to JP-A-2003-152009 (FIG. 3)), the terminal arrangement order is switched by preparing at least two conductor patterns on an insulative support substrate and adjusting the wire bonding positions in making connections to a semiconductor device.

Where bonding wires are crossed or the bonding positions are changed as in the conventional examples, variations occurs in the wire loop lengths and the angles of wire neck portions, which may cause trouble such as short-circuiting between wires or disconnection of a wire. In particular, such trouble is remarkable in devices such as vehicular pressure sensors in which wires are protected only by a soft member such as a gel member and which are used in a vibratory environment.

In a manufacturing process, changing the bonding positions requires procedure switching and determination of bonding conditions for keeping the bonding wires reliable, but this adversely affects the productivity. Furthermore, in cell packages such as the pressure sensor cell 80 having a semiconductor integrated circuit device and lead terminals, trimming may be performed to correct its characteristics after assembling into a package. In general, trimming is performed by monitoring an output characteristic while supplying power by connecting a probe or a socket to the lead terminals which lead from the resin cell package. Where the terminal arrangement is changed by changing the manner of wire bonding in the above-described manner, also the arrangement of the terminals of the probe or socket on the trimming apparatus side need to be changed each time according to the specification of the arrangement of the lead terminals of the cell package. This results in losses due to modification of the trimming apparatus and procedure switching at the time of manufacture.

SUMMARY

It would be desirable to solve the above problems and thereby provide a semiconductor device which is inexpensive, highly reliable, and can be applied to a wide variety of applications, as well as its manufacturing method.

The invention provides a semiconductor device comprising a resin cell package comprising a semiconductor integrated circuit device and plural lead terminals which are electrically connected to the semiconductor integrated circuit device and serve for electric connections to the outside; and an outer package mounted with the resin cell package and comprising plural connector terminals for electric connections to the outside, at least two groups of contact electrodes, and at least two groups of conductive interconnections provided so as to connect the at least two groups of contact electrodes to the plural connector terminals so as to produce different sets of combinations of arrangement positions of a contact electrode and a connector terminal that are connected to each other, the plural lead terminals being connected to one of the at least two groups of contact electrodes. All of the at least two groups of contact electrodes may be formed in the same plane.

At least part of at least one of the at least two groups of conductive interconnections may cross each other at two levels between at least one of the at least two groups of contact electrodes and the plural connector terminals so as to change a set of combinations of arrangement positions of a contact electrode and a connector terminal that are connected to each other. The at least two groups of conductive interconnections may be formed in the same plane as the at least two groups of contact electrodes.

The semiconductor device may be such that the plural lead terminals are three terminals which are a power terminal, an output terminal, and a ground terminal and the plural connector terminals are three terminals which are a power terminal, an output terminal, and a ground terminal.

The semiconductor device may be such that the plural lead terminals are three terminals which are a power terminal, an output terminal, and a ground terminal that are arranged in this order, the plural connector terminals are three terminals which are a power terminal, an output terminal, and a ground terminal, and the arrangement order of the plural connector terminals is converted into order of the output terminal, the ground terminal, and the power terminal by one of the at least two groups of conductive interconnections.

The semiconductor device may be such that the outer package is formed by resin molding, and the at least two groups of conductive interconnections and the at least two groups of contact electrodes are incorporated into the outer package by resin insert molding.

The semiconductor integrated circuit device may be part of a physical quantity sensor element.

The semiconductor device may be such that the resin cell package further comprises a physical quantity sensor element, and the semiconductor integrated circuit device and the physical quantity sensor element are electrically connected to each other.

The physical quantity sensor element may be a pressure sensor element.

The invention also provides a manufacturing method of a semiconductor device, comprising the steps of assembling the resin cell package; trimming a characteristic of the semiconductor integrated circuit device; and mounting the resin cell package in an outer package.

The invention provides another manufacturing method of a semiconductor device, comprising the steps of assembling the resin cell package; trimming an output characteristic of the physical quantity sensor element; and mounting the resin cell package in the outer package.

The invention provides still another manufacturing method of a semiconductor device, comprising the steps of assembling the resin cell package; trimming an output characteristic of the pressure sensor element; and mounting the resin cell package in the outer package.

According to the invention, a single device can accommodate plural terminal arrangement orders. Therefore, devices can be commonized and the development cost and lead time can be reduced.

The arrangement order of connecting means between the semiconductor integrated circuit device and lead terminals of the cell package is kept the same, and the wire bonding positions need not be changed. Therefore, in manufacture, procedure switching need not be made and hence wire bonding conditions need not be determined. This allows the reliability of wire bonding to be kept at a certain level.

Where the characteristic of the semiconductor integrated circuit is trimmed after assembling of the cell package, the arrangement order of the lead terminals of the cell package after the trimming is the same as that before the trimming. Therefore, devices can be trimmed with a common trimming apparatus and hence can be mass-produced by using the same production line.

With the above advantages, the invention can provide a semiconductor device which is inexpensive, highly reliable, and can be applied to a wide variety of applications, as well as its manufacturing method.

BRIEF DESCRIPTION OF THE DRAWINGS

The invention will be described with reference to certain preferred embodiments thereof and the accompanying drawings, wherein.

DETAILED DESCRIPTION OF THE PREFERRED EMBODIMENTS OF THE INVENTION

The present invention is intended to switch the arrangement order of connector terminals in a connector portion of an outer package without changing the arrangement order of electrode pads on a semiconductor integrated circuit device or the bonding positions of wire bonding between the semiconductor integrated circuit device and lead terminals. The invention will be described below by using pressure sensor devices as examples, although it will be understood that the invention is not limited to the specifically disclosed application.

Figure 1:
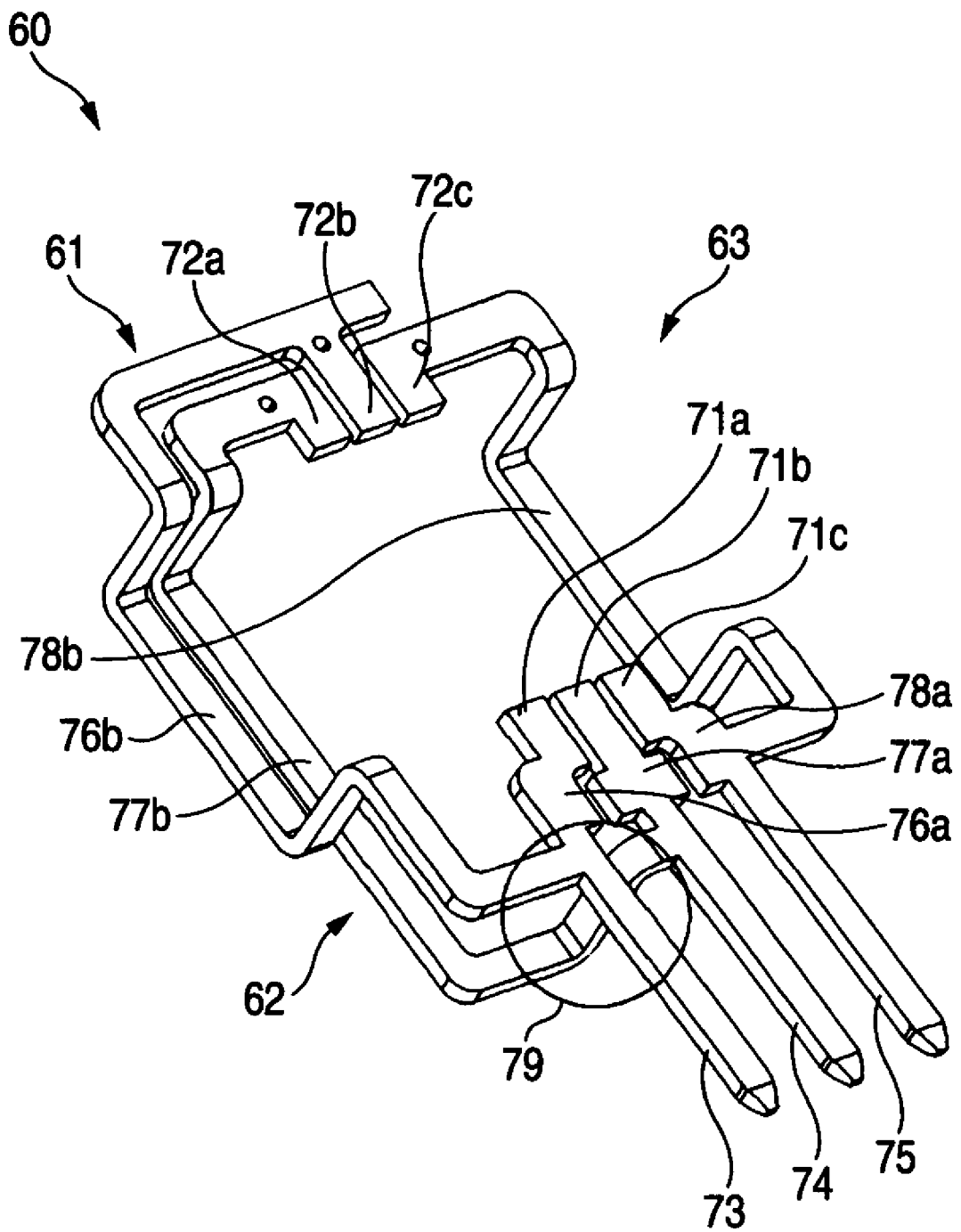
FIG. 1 is a perspective view of a lead frame according to a first embodiment of the present invention.

FIG. 1 is a perspective view of an exemplary lead frame as a main part according to a first embodiment of the invention which is provided in an outer package. The lead frame 60 is composed of three members 61-63, each of which is formed by a punching step and a press-bending step. More specifically, the lead frame 60 is provided with contact electrodes 71 (71a-71c), contact electrodes 72 (72a-72c), connector terminals 73-75, and conductive interconnections 76 (76a and 76b), 77 (77a and 77b), and 78 (78a and 78b) which are connected to the connector terminals 73, 74, and 75, respectively.

A crossing region 79 is provided where the conductive interconnections 76b and 77b which connect the contact electrodes 72a and 72b to the connector terminals 73 and 74, respectively, make a two-level crossing. Therefore, the arrangement order of the contact electrodes 71 is such that the contact electrodes 71a, 71b, and 71c are connected to the connector terminals 73, 74, and 75, respectively; that is, the arrangement direction of the contact electrodes 71a, 71b, and 71c is the same as that of the connector terminals 73, 74, and 75. On the other hand, the arrangement order of the contact electrodes 72 is such that the contact electrodes 72a, 72b, and 72c are connected to the connector terminals 74, 73, and 75, respectively, that is, the arrangement direction of the contact electrodes 72a and 72b is opposite to that of the connector terminals 73 and 74.

Figure 2:
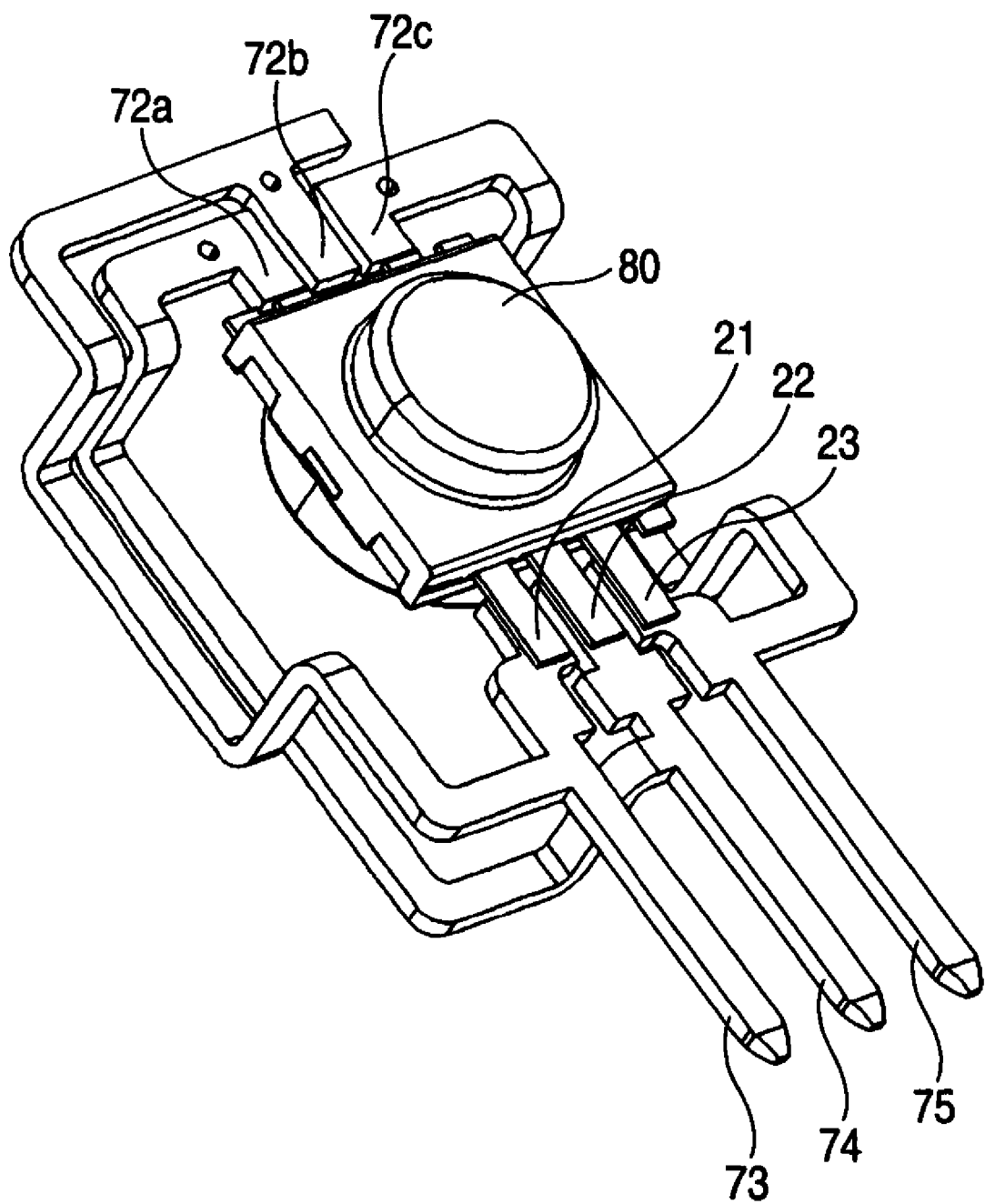
FIG. 2 is a perspective view of an assembly of the pressure sensor cell of FIGS. 8A and 8B and the lead frame of FIG. 1 according to the first embodiment of the invention.
Figure 8A:
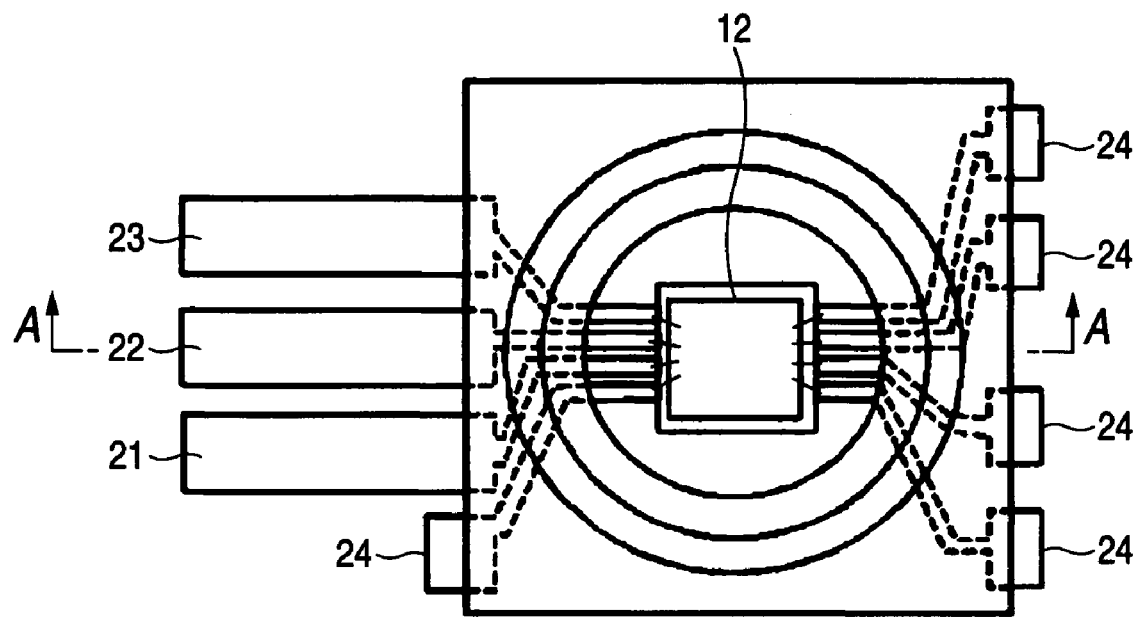
FIGS. 8A and 8B are schematic diagrams of a conventional pressure sensor cell package.
Figure 8B:
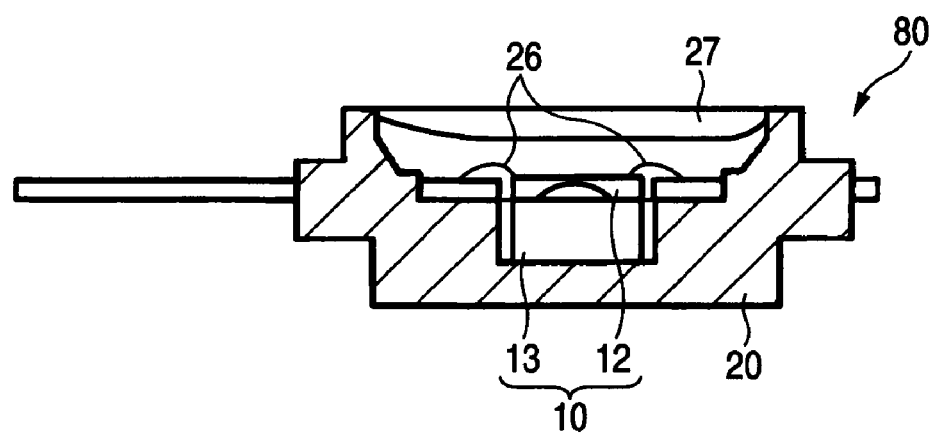
Figure 9A:
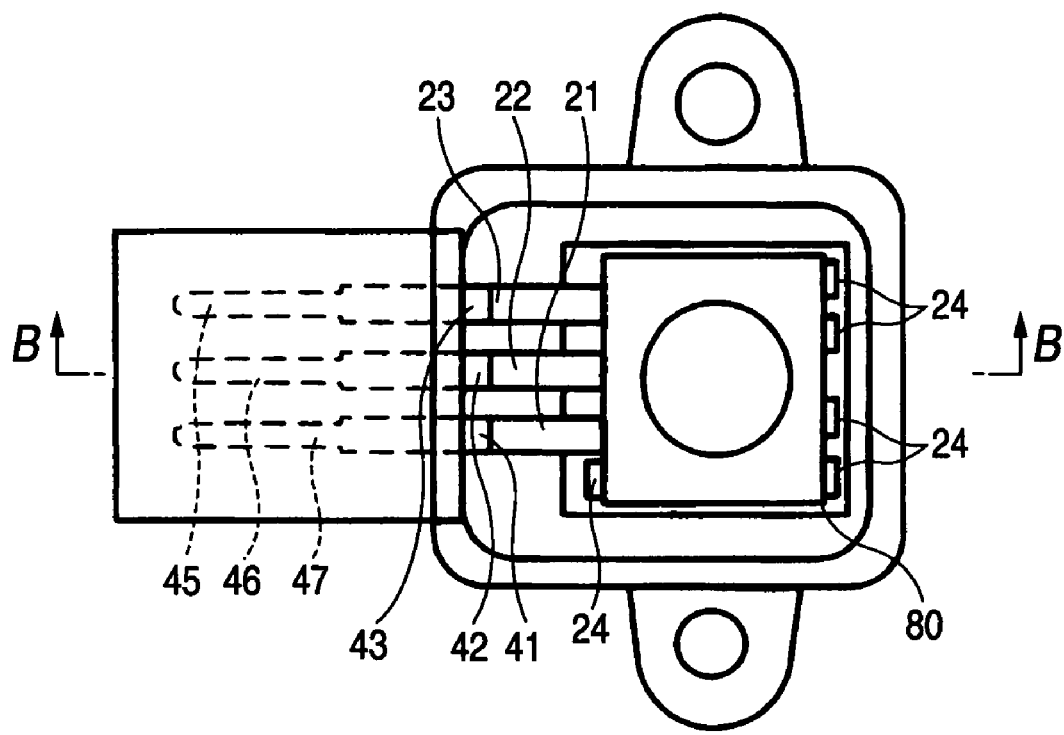
FIGS. 9A and 9B are schematic diagrams of a conventional pressure sensor device.
Figure 9B:
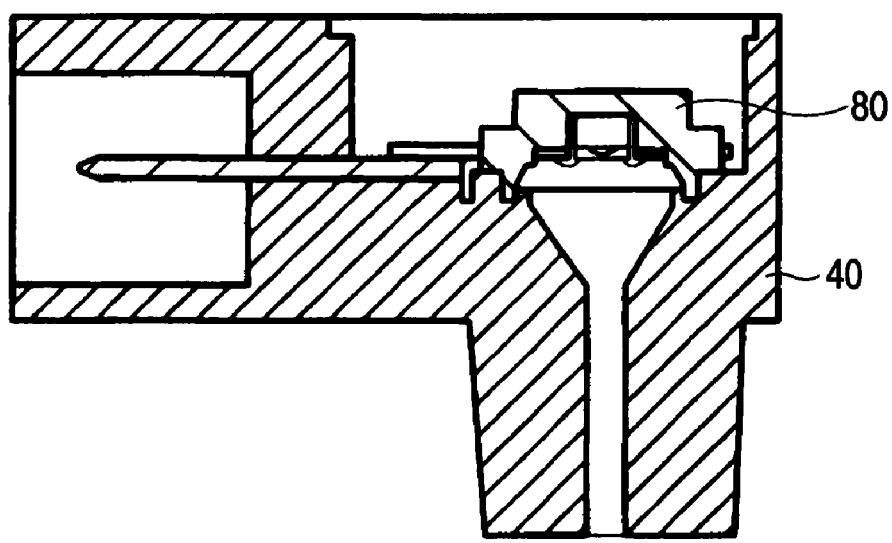

FIG. 2 is a perspective view of an assembly of the pressure sensor cell 80 of FIGS. 8A and 8B and the lead frame 60 of FIG. 1 according to the first embodiment of the invention. The power lead terminal 21, the output lead terminal 22, and the ground potential lead terminal 23 are welded to the contact terminals 71a, 71b, and 71c, respectively, whereby electrical continuity is established between them. As a result, the connector terminals 73, 74, and 75 become a power terminal, an output terminal, and a ground terminal, respectively.

Figure 3:
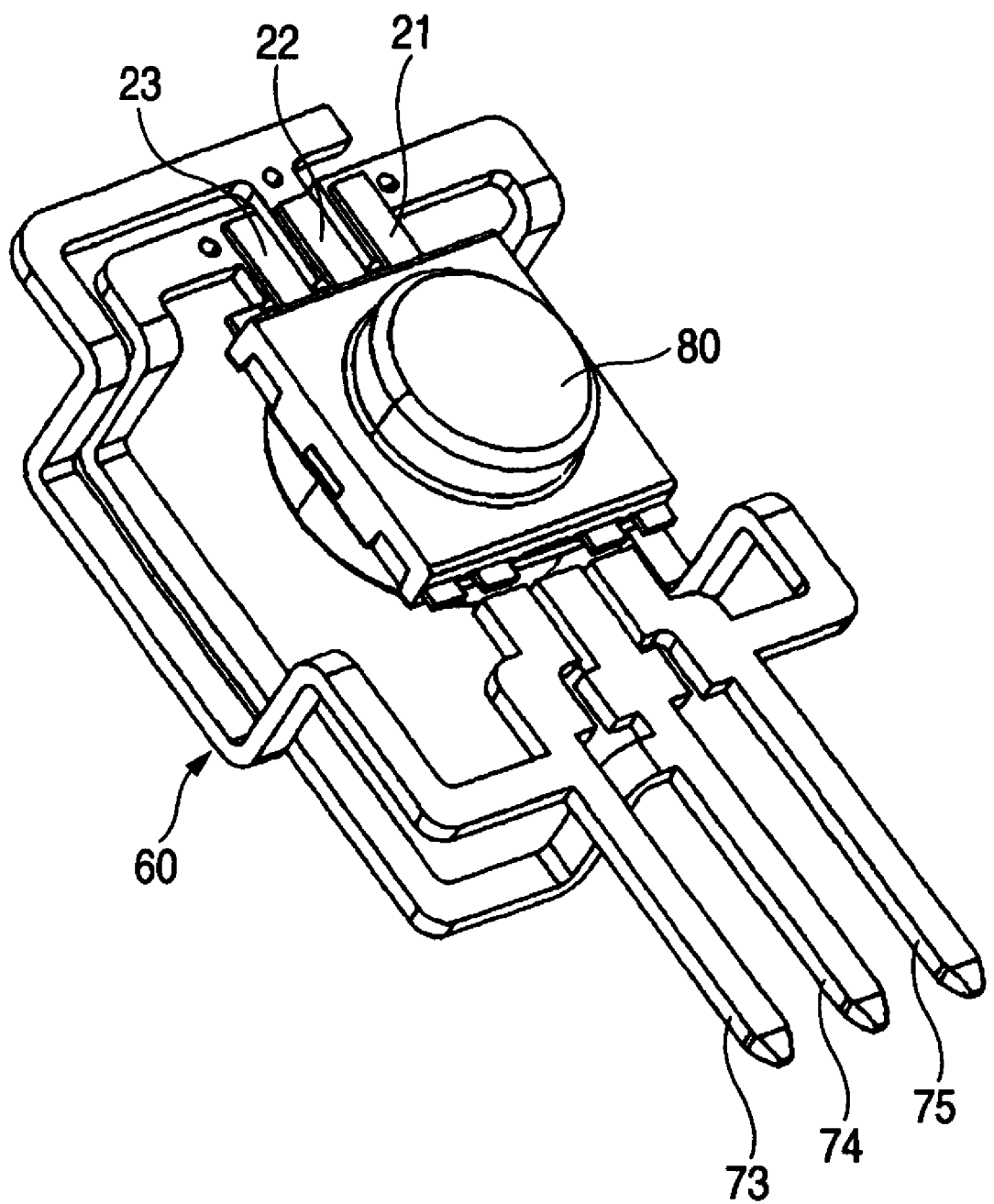
FIG. 3 is a perspective view of another assembly of the pressure sensor cell of FIGS. 8A and 8B and the lead frame of FIG. 1 according to the first embodiment of the invention.

FIG. 3 is a perspective view of another assembly of the pressure sensor cell 80 of FIGS. 8A and 8B and the lead frame 60 of FIG. 1 according to the first embodiment of the invention. As shown in FIG. 3, the pressure sensor 80 is attached to the lead frame 60 so as to be rotated by 180° from the orientation of FIG. 2. The ground potential lead terminal 23, the output lead terminal 22, and the power lead terminal 21 are welded to the contact terminals 72a, 72b, and 72c, respectively, whereby electrical continuity is established between them. As a result, the connector terminals 73, 74, and 75 become an output terminal, a ground terminal, and a power terminal, respectively.

As described above, switching can be made between the two arrangement orders of the connector terminals 73-75 of the outer package by choosing the mounting orientation of the pressure sensor cell 80 and connecting the lead terminals 21-23 which lead from the pressure sensor cell 80 selectively to one of the two groups of contact electrodes 71 and 72.

Figure 4A:
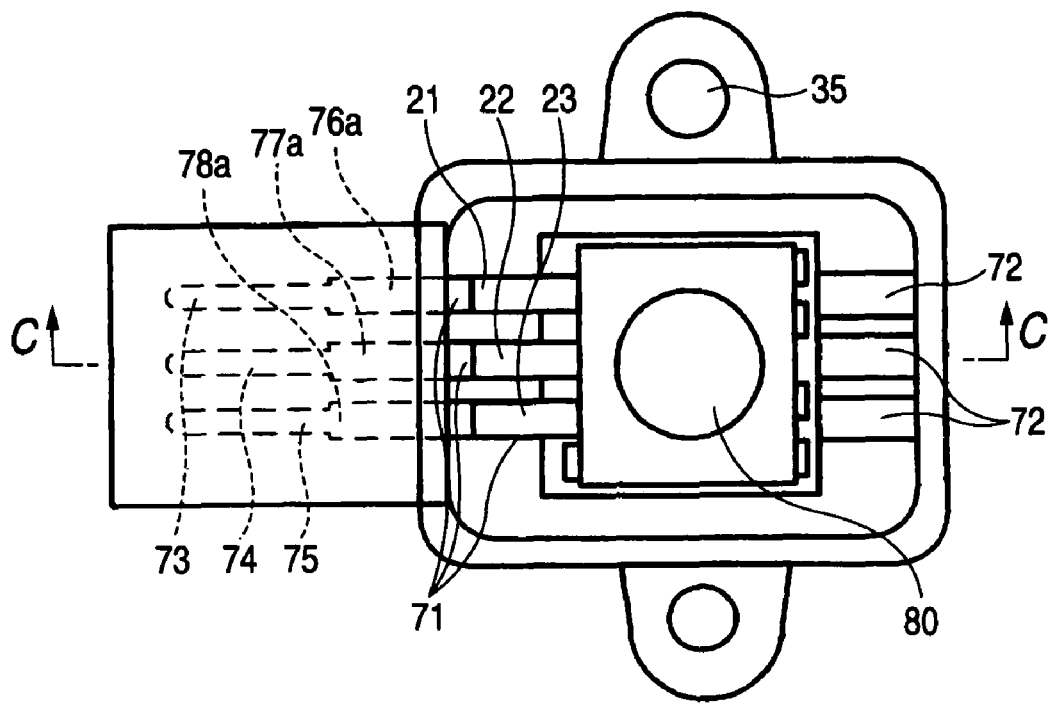
FIGS. 4A and 4B are a schematic plan view and sectional view, respectively, of a pressure sensor device according to the first embodiment of the invention.
Figure 4B:
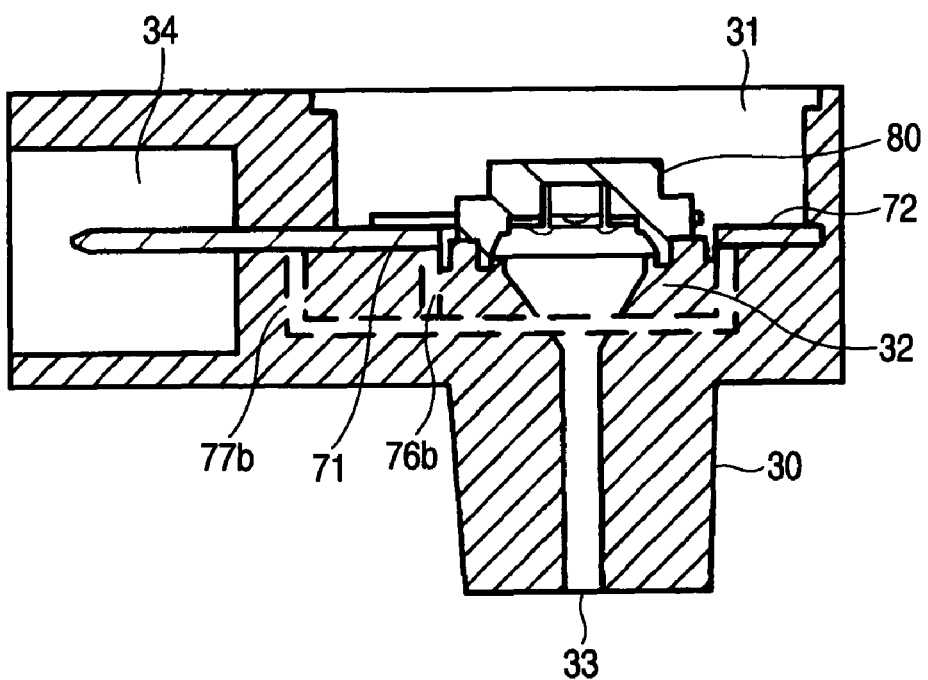

FIGS. 4A and 4B are schematic diagrams of a pressure sensor device according to the first embodiment of the invention. FIG. 4A is a plan view and FIG. 4B is a sectional view taken along line C-C in FIG. 4A. An outer package 30 is formed by resin molding, and is provided with a containing portion 31 for containing the pressure sensor cell 80, a mounting portion 32 which can be mounted with the pressure sensor cell 80 with different orientations, a pressure introduction hole 33, a connector portion 34, attachment portions 35, a cap 36 shown in FIG. 5, and the lead frame 60 of FIG. 1. The lead frame 60 is incorporated into the outer package 30 by insert molding. The contact electrodes 71 and 72 are exposed in the containing portion 31 and parts of the connector terminals 73-75 are exposed in the connector portion 33. The conductive interconnections 76-78 are buried in the outer package 30. In FIG. 4, the lead terminals 21-23 are connected to the contact electrodes 71 as in the case of FIG. 2.

Figure 5:
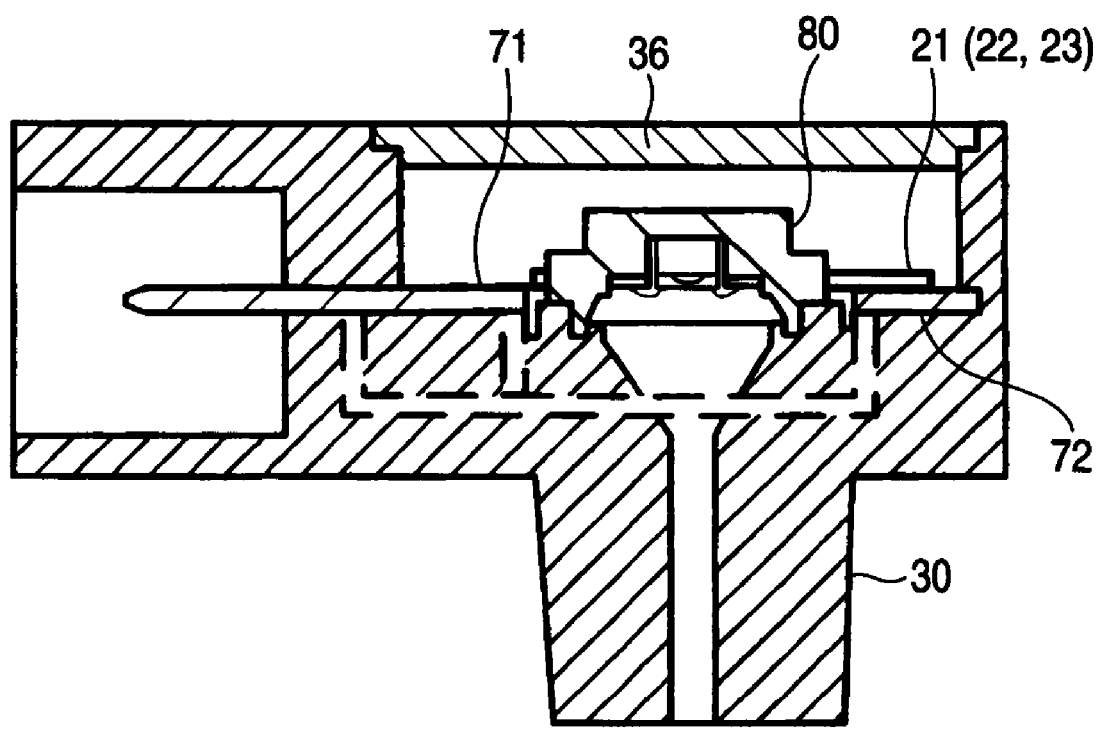
FIG. 5 is a schematic sectional view of another pressure sensor device according to the first embodiment of the invention.

FIG. 5 is a schematic sectional view of another pressure sensor device according to the first embodiment of the invention and corresponds to FIG. 4B. The outer package 30 shown in FIG. 5 is the same as shown in FIGS. 4A and 4B. This pressure sensor device is different from the pressure sensor device of FIGS. 4A and 4B in that the lead terminals 21-23 are connected to the contact electrodes 72 as in the case of FIG. 3.

As described above with reference to FIGS. 4A and 4B and FIG. 5, since the outer package 30 is provided with the two groups of contact electrodes 71 and 72 and the lead terminals 21-23 of the pressure sensor cell 80 can be connected selectively to one of the two groups of contact electrodes 71 and 72, the single pressure cell sensor 80 can accommodate the two arrangement orders of the connector terminals 73-75.

Figure 6A:
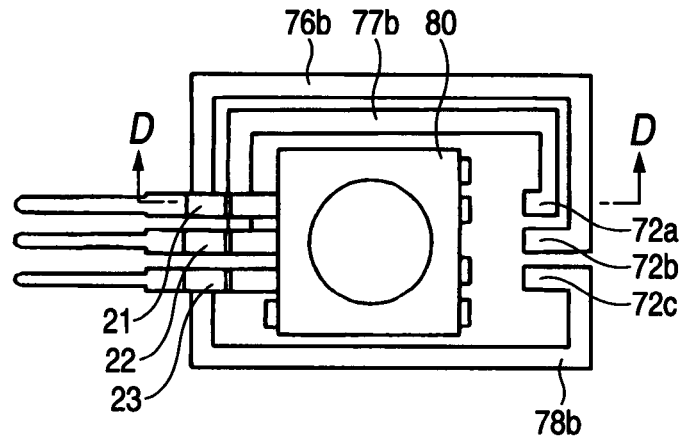
FIGS. 6A-6C are schematic views showing assemblies of the pressure sensor cell of FIGS. 8A and 8B and a lead frame according to a second embodiment of the invention.
Figure 6B:
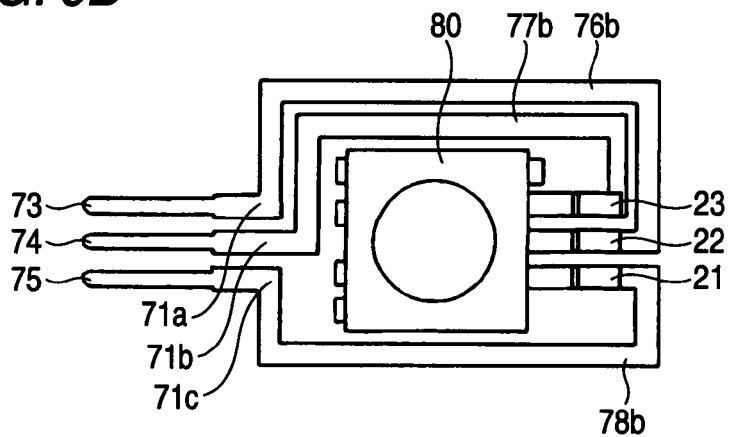
Figure 6C:
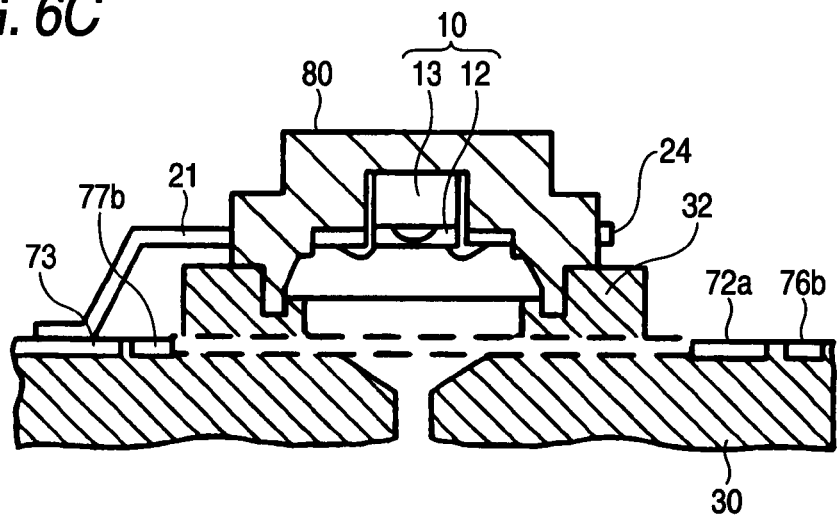
Figure 7A:
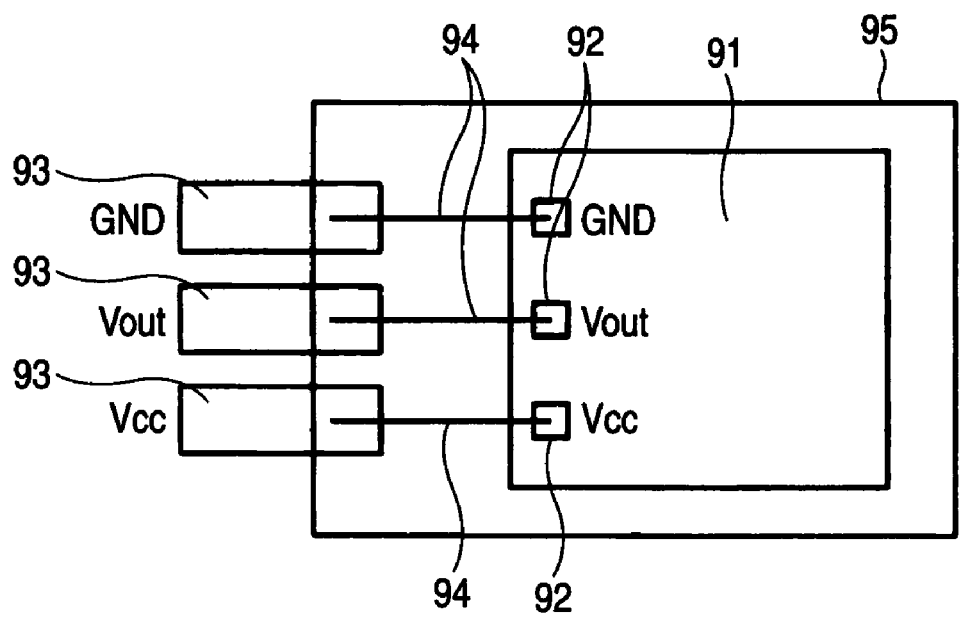
FIGS. 7A and 7B are plan views of important parts of conventional semiconductor devices each of which is composed of a semiconductor integrated circuit device and a package that is mounted with the semiconductor integrated circuit device.
Figure 7B:
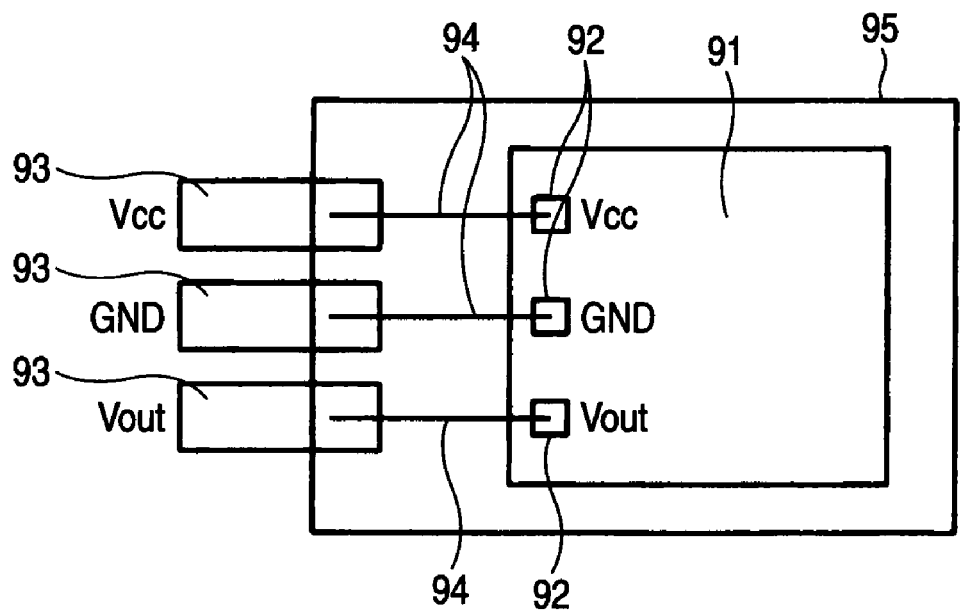

FIGS. 6A-6C show assemblies of the pressure sensor cell 80 of FIGS. 8A and 8B and a lead frame according to a second embodiment of the invention. FIG. 8A is a plan view of a case that the lead terminals 21-23 are connected to contact electrodes 71. FIG. 8B is a plan view of a case that the lead terminals 21-23 are connected to contact electrodes 72. FIG. 8C is a schematic sectional view of an important part taken along line D-D in FIG. 6A.

The lead terminals 21-23 which lead from the pressure sensor cell 80 and are connected to the contact electrodes 71 of an outer package 30 are bent as shown in FIG. 6C. This makes it possible to flush conductive interconnections 76*b*, 77*b*, and 78*b* of the outer package 30 with the contact electrodes 72. As a result, a step of press-bending a lead frame 60 of the outer package 30 can be omitted and the wiring of the conductive interconnections 76-78 can be simplified.

Although the first and second embodiments are directed to the case that the semiconductor integrated circuit device is part of the pressure detecting element, the invention can likewise be applied to a case that the pressure detecting element is replaced by an element for detecting another physical quantity. A pressure detecting element or an element for detecting another physical quantity may be disposed in a cell package as a detecting device that is separate from a semiconductor integrated circuit device. In this case, a means for electrically connecting the detecting device and the semiconductor integrated circuit device is necessary. The invention can also be applied to a case that a semiconductor integrated circuit device not incorporating a detecting device is disposed in a resin cell package. In this case, the resin cell package may be such that the semiconductor integrated circuit device and lead terminals are sealed in with a resin.

Although the first and second embodiments are directed to the case that the two groups of contact electrodes are provided, it goes without saying that three or more groups of contact electrodes may be provided.

The invention has been described with reference to certain preferred embodiments thereof, it will be understood, however, that variations and modifications are possible within the scope of the appended claims.

What is claimed is:

1. A semiconductor device comprising:
 a resin cell package including a semiconductor integrated circuit device and at least first, second, and third lead terminals which are electrically connected to the semiconductor integrated circuit device and serve for electric connections to the outside; and
 an outer package mounted with the resin cell package and comprising:
 at least first, second, and third connector terminals for electric connections to the outside;
 at least first and second groups of first, second, and third contact electrodes;
 at least first and second groups of first, second, and third conductive interconnections connecting the first and second groups of the first, second, and third contact electrodes to the first, second, and third connector terminals;
 a first connecting section comprising the first, second, and third contact electrode of the first group; and
 a second connecting section comprising the first, second, and third contact electrode of the second group,
 wherein the first, second, and third lead terminals are connectable to either of the first or second connecting section via the first, second, and third conductive interconnections of the first or second group,
 wherein connecting the first, second, and third lead terminals to the first connection section connects the first lead terminal to the first connector terminal, the second lead terminal to the second connector terminal, and the third lead terminal to the third connector terminal, via the first, second, and third conductive interconnections of the first group, and
 wherein the first, second, third lead terminals; to the second connection section connects the first lead terminal to the second or third connector terminal, the second lead terminal to the first or third connector terminal, and the third lead terminal to the first or second connector terminal, via the first, second, and third conductive interconnections of the second group.

2. The semiconductor device according to claim 1, wherein all of the at least the first and second groups of the first, second, and third contact electrodes are formed in the same plane.

3. The semiconductor device according to claim 2, wherein the at least part of the first and second groups of conductive interconnections are formed in the same plane as the first and second groups of the first, second, and third contact electrodes.

4. The semiconductor device according to claim 1, wherein at least part of at least one of the at least first or second groups of conductive interconnections cross each other at two levels between at least one of the at least first or second groups of the first, second, and third contact electrodes and the first, second, and third connector terminals.

5. The semiconductor device according to claim 1, wherein the first, second, and third lead terminals are a power terminal, an output terminal, and a ground terminal, respectively, the power terminal being adjacent to the output terminal, which is adjacent to the ground terminal so that the output terminal is positioned between the power and ground terminals.

6. The semiconductor device according to claim 5, wherein:
 the first connecting section connects the plural power terminal to the first contact electrode of the first group via the first conductive interconnection of the first group so that the first connector terminal connects to the power terminal, the output terminal to the second contact electrode of the first group via the second conductive interconnection of the first group so that the second connector terminal connects to the output terminal, and the ground terminal to the third contact electrode of the first group via the third conductive interconnection of the first group so that the third connector terminal connects to the ground terminal, and
 the second connecting section connects the power terminal to the first contact electrode of the second group via the second or third conductive interconnection of the second group so that the second or third connector terminal connects to the power terminal, the output terminal to the second contact electrode of the second group via the first or third conductive interconnection of the second group so that the first or third connector terminal connects to the output terminal, and the ground terminal to the third contact electrode of the second group via the first or second conductive interconnection of the second group so that the first or second connector terminal connects to the ground terminal.

7. The semiconductor device according to claim 1, wherein the outer package is formed by resin molding, and the at least first and second groups of the first, second, and third conductive interconnections and the at least the first and second groups of the first, second, and third contact electrodes are incorporated into the outer package by resin insert molding.

8. The semiconductor device according to claim 1, wherein the semiconductor integrated circuit device is part of a physical quantity sensor element.

9. The semiconductor device according to claim 8, wherein the physical quantity sensor element is a pressure sensor element.

10. The semiconductor device according to claim 1, wherein the resin cell package further comprises a physical quantity sensor element, and the semiconductor integrated circuit device and the physical quantity sensor element are electrically connected to each other.

11. The semiconductor device according to claim 9, wherein the physical quantity sensor element is a pressure sensor element.

12. A method of manufacturing a semiconductor device comprising:
   a resin cell package including a semiconductor integrated circuit device and at least first, second, and third lead terminals which are electrically connected to the semiconductor integrated circuit device and serve for electric connections to the outside; and
   an outer package mounted with the resin cell package and comprising:
      at least first, second, and third connector terminals for electric connections to the outside;
      at least first and second groups of first, second, and third contact electrodes;
      at least first and second groups of first, second, and third conductive interconnections connecting the first and second groups of the first, second, and third contact electrodes to the first, second, and third connector terminals;
      a first connecting section comprising the first, second, and third contact electrode of the first group; and
      a second connecting section comprising the first, second, and third contact electrode of the second group,
   wherein the first, second, and third lead terminals are connectable to either of the first or second connecting section via the first, second, and third conductive interconnections of the first or second group,
   wherein connecting the first, second, and third lead terminals to the first connection section connects the first lead terminal to the first connector terminal, the second lead terminal to the second connector terminal, and the third lead terminal to the third connector terminal, via the first, second, and third conductive interconnections of the first group, and
   wherein the first, second, third lead terminals; to the second connection section connects the first lead terminal to the second or third connector terminal, the second lead terminal to the first or third connector terminal, and the third lead terminal to the first or second connector terminal, via the first, second, and third conductive interconnections of the second group,
   the method comprising the steps of:
   assembling the resin cell package;
   trimming an output characteristic of the semiconductor integrated circuit device; and
   mounting the resin cell package in the outer package.

13. The method according to claim 12, wherein the semiconductor integrated circuit device is part of a physical quantity sensor element, and the trimming step comprises trimming an output characteristic of the physical quantity sensor element.

14. The method according to claim 13, wherein the physical quantity sensor element is a pressure sensor element.

15. A method of manufacturing a semiconductor device comprising:
   a resin cell package including a semiconductor integrated circuit device, a physical quantity sensor element electrically connected to the semiconductor integrated circuit device, and at least first, second, and third lead terminals which are electrically connected to the semiconductor integrated circuit device and serve for electric connections to the outside; and
   an outer package mounted with the resin cell package and comprising:
      at least first, second, and third connector terminals for electric connections to the outside;
      at least first and second groups of first, second, and third contact electrodes;
      at least first and second groups of first, second, and third conductive interconnections connecting the first and second groups of the first, second, and third contact electrodes to the first, second, and third connector terminals;
      a first connecting section comprising the first, second, and third contact electrode of the first group; and
      a second connecting section comprising the first, second, and third contact electrode of the second group,
   wherein the first, second, and third lead terminals are connectable to either of the first or second connecting section via the first, second, and third conductive interconnections of the first or second group,
   wherein connecting the first, second, and third lead terminals to the first connection section connects the first lead terminal to the first connector terminal, the second lead terminal to the second connector terminal, and the third lead terminal to the third connector terminal, via the first, second, and third conductive interconnections of the first group, and
   wherein the first, second, third lead terminals; to the second connection section connects the first lead terminal to the second or third connector terminal, the second lead terminal to the first or third connector terminal, and the third lead terminal to the first or second connector terminal, via the first, second, and third conductive interconnections of the second group,
   the method comprising the steps of:
   assembling the resin cell package;
   trimming an output characteristic of the physical quantity sensor element; and
   mounting the resin cell package in the outer package.

* * * * *